(12) United States Patent
Ogawa

(10) Patent No.: US 7,273,775 B1
(45) Date of Patent: Sep. 25, 2007

(54) RELIABLE AND SCALABLE VIRTUAL GROUND MEMORY ARRAY FORMED WITH REDUCED THERMAL CYCLE

(75) Inventor: Hiroyuki Ogawa, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/242,773

(22) Filed: Oct. 4, 2005

(51) Int. Cl.
*H01L 21/336* (2006.01)

(52) U.S. Cl. ............... 438/201; 438/211; 438/257; 438/593; 438/622; 438/626; 438/631; 438/637

(58) Field of Classification Search ........... 438/622, 438/626, 631, 637, FOR. 355, 201, 211, 438/257, 593, FOR. 203
See application file for complete search history.

(56) References Cited

U.S. PATENT DOCUMENTS

| | | | |
|---|---|---|---|
| 6,187,624 B1 * | 2/2001 | Huang | 438/253 |
| 6,365,456 B1 * | 4/2002 | Cereda et al. | 438/257 |
| 2001/0000242 A1 * | 4/2001 | Huang | 438/106 |
| 2001/0003663 A1 * | 6/2001 | Huang | 438/240 |

* cited by examiner

*Primary Examiner*—George Fourson
*Assistant Examiner*—Joannie Adelle Garcia
(74) *Attorney, Agent, or Firm*—Farjami & Farjami LLP

(57) ABSTRACT

According to one exemplary embodiment, a method of fabricating a virtual ground memory array includes forming a number of polysilicon segments on a gate dielectric layer, where the gate dielectric layer is situated on a substrate. The method further includes forming a number of bitlines in the substrate, where each of the bitlines is situated adjacent to at least one of the polysilicon segments, and where the bitlines are formed after the polysilicon segments. The method further includes forming a gap-filling dielectric segment over each of the bitlines. The method can further include removing the masking layer and a portion of the gap-filling dielectric segment, depositing an interpoly dielectric layer on the polysilicon segments and on a remaining portion of the gap-filling dielectric segment, and forming a second polysilicon layer on the interpoly dielectric layer.

6 Claims, 8 Drawing Sheets

RELIABLE AND SCALABLE VIRTUAL GROUND MEMORY ARRAY FORMED WITH REDUCED THERMAL CYCLE

TECHNICAL FIELD

The present invention is generally in the field of semiconductor devices. More particularly, the invention is in the field of fabrication of memory arrays.

BACKGROUND ART

A virtual ground memory array architecture is often used for flash memory arrays, such as floating gate flash memory arrays. During a typical conventional fabrication process for a virtual ground floating gate memory array, a layer of silicon nitride can be deposited, patterned, and etched to form silicon nitride segments on a layer of silicon oxide, which is formed on a substrate. A dopant, such as arsenic, can then be implanted in the substrate in gaps between adjacent silicon nitride segments to form bitlines. An oxidation process is next performed to grow a thick oxide layer over each bitline, and the silicon nitride segments are removed. A tunnel oxide layer is then formed over the substrate, and a layer of polysilicon is deposited, patterned, and etched to form polysilicon segments over the tunnel oxide layer.

However, in the conventional fabrication process discussed above, the oxidation process that is performed after the bitline implant requires a high thermal cycle, which can cause undesirable bitline dopant diffusion. Another problem with the conventional fabrication process discussed above is that the bitline implant is not self-aligned to the polysilicon segments, which can undesirably affect virtual ground floating gate memory array reliability.

Virtual ground memory arrays, such as virtual ground flash memory arrays, have also been formed using an Oxide-Nitride-Oxide (ONO) stack for localized charge storage. However, virtual ground memory arrays formed using an ONO stack for charge storage can be difficult to scale and can have low reliability.

Thus, there is a need in the art for an effective method for fabricating a virtual ground memory array, such as a virtual ground flash memory array, having increased reliability and scalability.

SUMMARY

The present invention is directed to a reliable and scalable virtual ground memory array formed with reduced thermal cycle. The present invention addresses and resolves the need in the art for an effective method for fabricating a virtual ground memory array, such as a virtual ground flash memory array, having increased reliability and scalability.

According to one exemplary embodiment, a method of fabricating a virtual ground memory array includes forming a number of polysilicon segments on a gate dielectric layer, where the gate dielectric layer is situated on a substrate. The virtual ground memory array can be a virtual ground floating gate memory array, such as virtual ground floating gate flash memory array, for example. The polysilicon segments can be formed by depositing a first polysilicon layer over the gate dielectric layer, depositing a masking layer over the first polysilicon layer, and patterning and etching the masking layer and the first polysilicon layer, where the step of depositing the masking layer is performed after the step of depositing the first polysilicon layer.

According to this embodiment, the method further includes forming a number of bitlines in the substrate, where each of the bitlines is situated adjacent to at least one of the polysilicon segments, where the bitlines are formed after the polysilicon segments, and where the bitlines are self-aligned to the polysilicon segments. The method further includes forming a gap-filling dielectric segment over each of the bitlines. The gap-filling dielectric segment can be high density plasma oxide, for example, and can be formed by depositing a gap-filling dielectric layer over the polysilicon segments and the gate dielectric layer and planarizing the gap-filling dielectric layer. The method can further include removing the masking layer and a portion of the gap-filling dielectric segment and depositing an interpoly dielectric layer on the polysilicon segments and on a remaining portion of the gap-filling dielectric segment. The method can further include forming a second polysilicon layer on the interpoly dielectric layer. Other features and advantages of the present invention will become more readily apparent to those of ordinary skill in the art after reviewing the following detailed description and accompanying drawings.

DETAILED DESCRIPTION OF THE INVENTION

Figure 1:
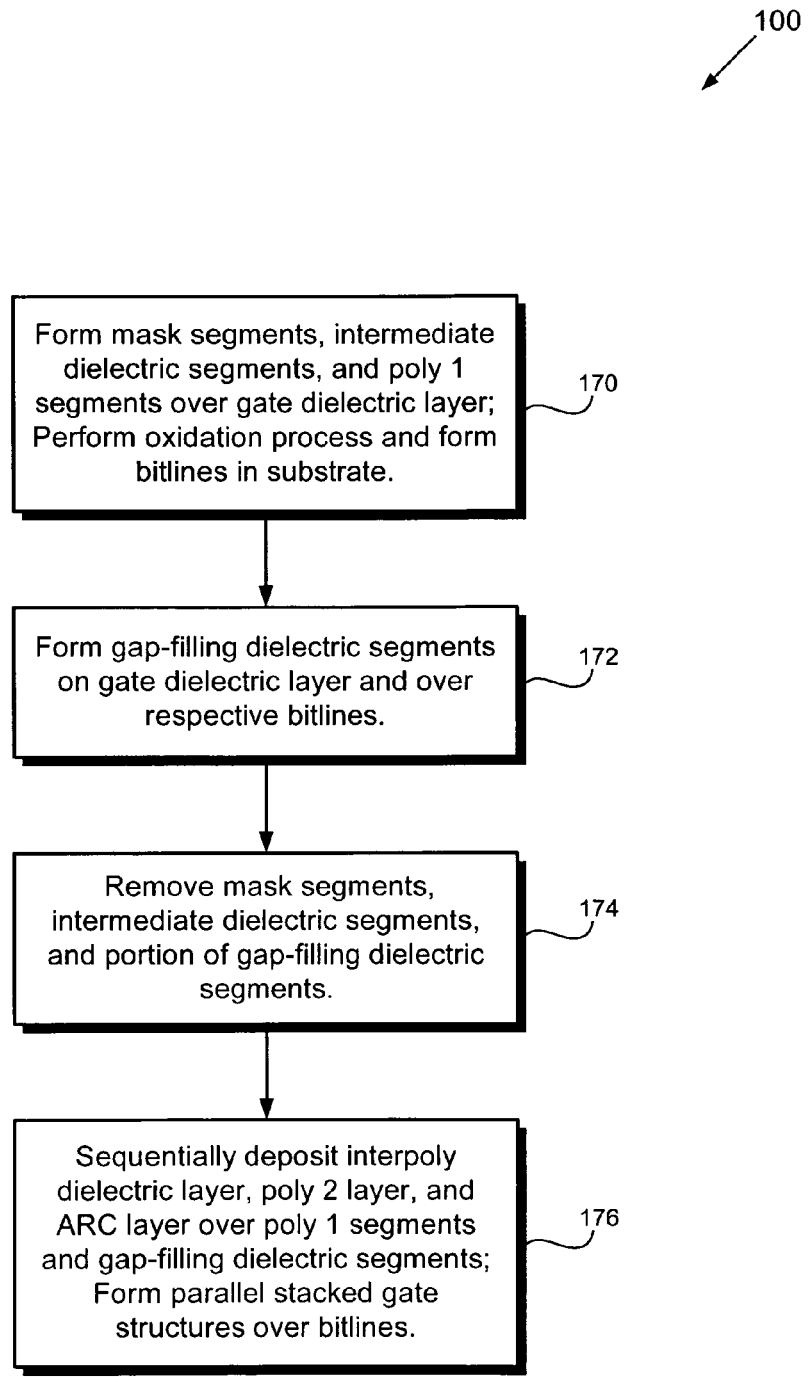
FIG. 1 shows a flowchart illustrating the steps taken to implement an embodiment of the present invention.

The present invention is directed to a directed to a reliable and scalable virtual ground memory array formed with reduced thermal cycle. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. It should be borne in mind that, unless noted otherwise, like or corresponding elements among the figures may be indicated by like or corresponding reference numerals.

FIG. 1 shows a flowchart illustrating an exemplary method according to an embodiment of the present invention. Certain details and features have been left out of flowchart 100 that are apparent to a person of ordinary skill in the art. For example, a step may consist of one or more substeps or may involve specialized equipment, as known in the art. While steps 170 through 176 indicated in flowchart 100 are sufficient to describe one embodiment of the present invention, other embodiments of the invention may use steps that are different from those shown in flowchart 100. It is noted that the processing steps shown in flowchart 100 are performed on a wafer, which, prior to step 170, includes a gate dielectric layer situated on a substrate, a first polysilicon (poly 1) layer situate on the gate dielectric layer, an intermediate dielectric layer situated on the poly 1 layer, and a masking layer situated on the intermediate dielectric layer.

Referring to FIGS. 2A, 2B, 2C, and 2D, each of structures 270, 272, 274, and 276 illustrates the result of performing steps 170, 172, 174, and 176 respectively, of flowchart 100 in FIG. 1. For example, structure 270 shows the result of performing step 170, structure 272 shows the result of performing step 172, and so forth. Structures 270, 272, 274, and 276 illustrate intermediate structures that are formed during fabrication of a virtual ground floating gate memory array, such as a virtual ground floating gate flash memory array, according to an embodiment of the present invention.

Figure 2A:
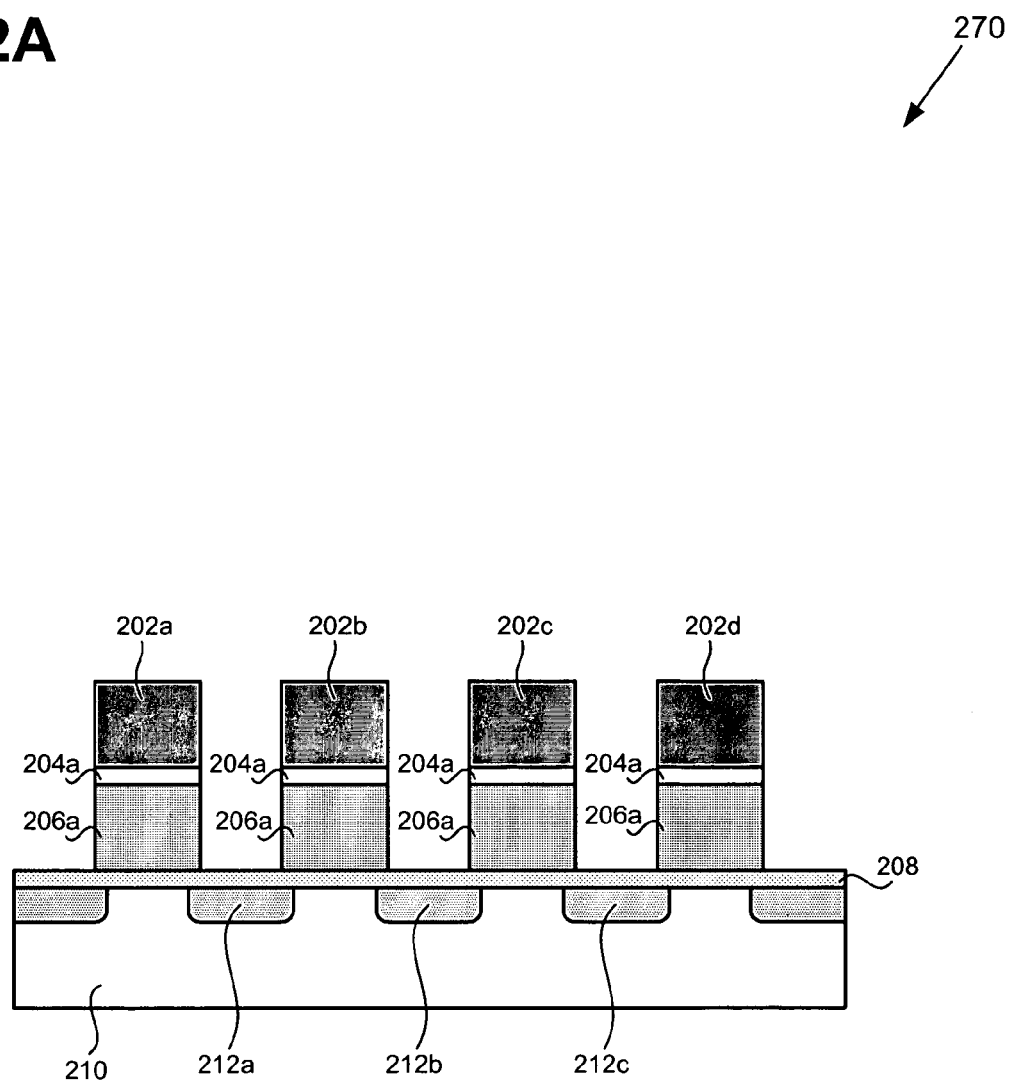
FIG. 2A illustrates a cross-sectional view, which includes a portion of a wafer processed according to an embodiment of the invention, corresponding to an initial step in the flowchart in FIG. 1.

Referring now to step 170 in FIG. 1 and structure 270 in FIG. 2A, at step 170 of flowchart 100, mask segments 202a, 202b, 202c, and 202d (hereinafter "mask segments 202a through 202d"), intermediate oxide segments 204a, 204b, 204c, and 204d (hereinafter "intermediate oxide segments 204a through 204d"), and first polysilicon layer (poly 1) segments 206a, 206b, 206c, and 206d (hereinafter "poly 1 segments 206a through 206d") over gate dielectric layer 208. As shown in FIG. 2A, gate dielectric layer 208 is situated on substrate 210 and can comprise a layer of tunnel oxide or other appropriate dielectric material, which can be formed by using an appropriate deposition process. Also shown in FIG. 2A, poly 1 segments 206a through 206d are situated on gate dielectric layer 208, intermediate oxide segments 204a through 204d are situated on poly 1 segments 206a through 206d, and mask segments 202a through 202d are situated on intermediate oxide segments 204a through 204d, respectively.

Poly 1 segments 206a through 206d can comprise polycrystalline silicon, intermediate oxide segments 204a through 204d can comprise high temperature oxide (HTO) or other appropriate oxide, and mask segments 202a through 202d can comprise silicon nitride or other appropriate dielectric material. Poly 1 segments 206a through 206d, intermediate oxide segments 204a through 204d, and mask segments 202a through 202d can be formed, for example, by sequentially depositing a layer of polysilicon, a layer of HTO, and a layer of silicon nitride, respectively, over gate dielectric layer 208. The layers of polysilicon, HTO, and silicon nitride can then be appropriately patterned and etched to form poly 1 segments 206a through 206d, intermediate oxide segments 204a through 204d, and mask segments 202a through 202d.

Also at step 170 of flowchart 100, an oxidation process is performed and bitlines 212a, 212b, and 212c are formed in substrate 210. During the oxidation process, a thin oxide layer (not shown in FIG. 2A) is formed on the sidewalls of poly 1 segments 206a through 206d. Further shown in FIG. 2A, bitlines 212a, 212b, and 212c are situated in substrate 210 adjacent to at least one poly 1 segment. For example, bitline 212a is situated adjacent to poly 1 segments 206a and 206b, bitline 212b is situated adjacent to poly 1 segments 206b and 206c, and so forth. Bitlines 212a, 212b, and 212c can comprise arsenic or other appropriate dopant, which can be implanted in substrate 210 in an appropriate dopant implantation process. It is noted that only bitlines 212a, 212b, and 212c are specifically discussed herein to preserve brevity. The result of step 170 of flowchart 100 is illustrated by structure 270 in FIG. 2A.

Figure 2B:
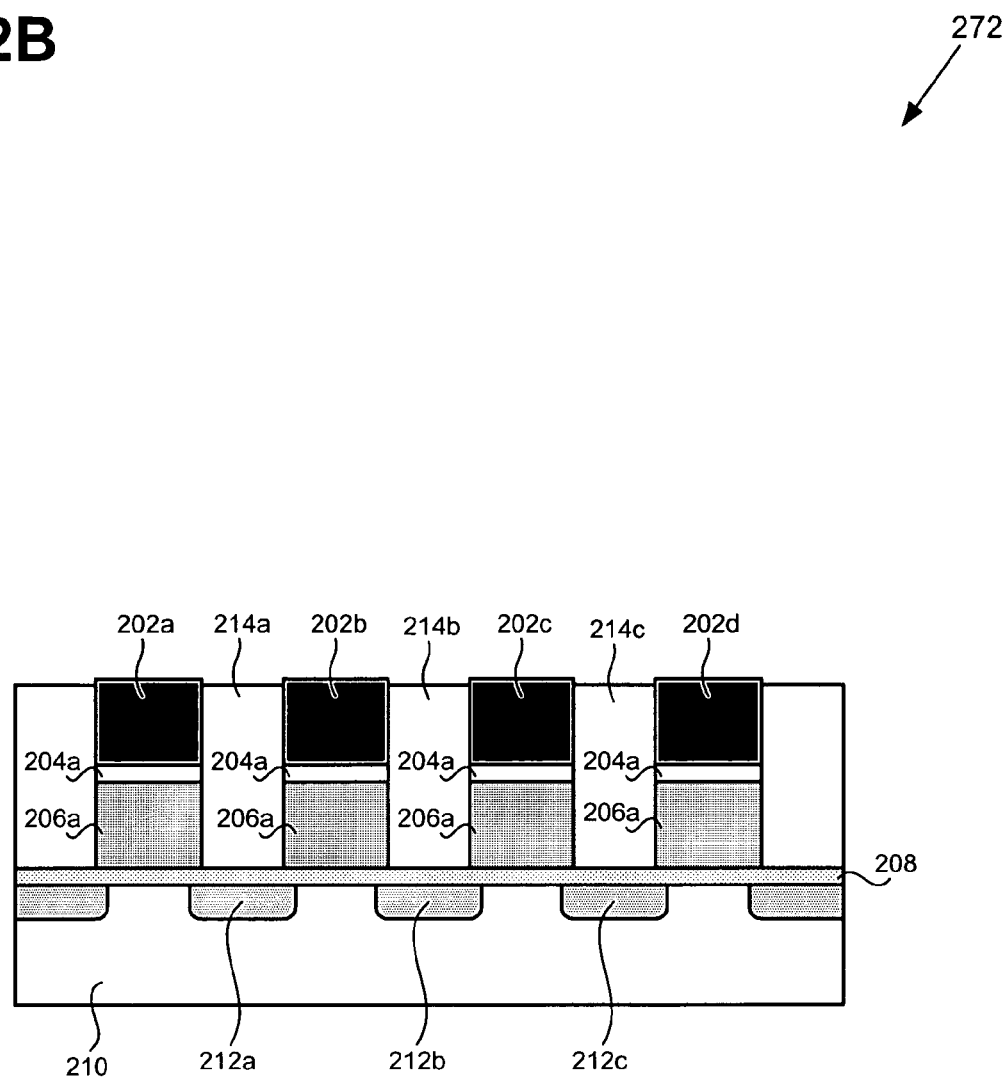
FIG. 2B illustrates a cross-sectional view, which includes a portion of a wafer processed according to an embodiment of the invention, corresponding to an intermediate step in the flowchart in FIG. 1.

Referring to step 172 in FIG. 1 and structure 272 in FIG. 2B, gap-filling dielectric segments 214a, 214b, and 214c are formed over gate dielectric layer 208 and over respective bitlines 212a, 212b, and 212c. As shown in FIG. 2A, gap-filling dielectric segments 214a, 214b, and 214c are situated on gate dielectric layer 208, over respective bitlines 212a, 212b, and 212c, and between adjacent poly 1 segments. For example, gap-filling dielectric segment 214a is situated between poly 1 segments 206a and 206b, gap-filling dielectric segment 214b is situated between poly 1 segments 206b and 206c, and so forth. Gap-filling dielectric segments 214a, 214b, and 214c can comprise high density plasma (HDP) oxide. In other embodiments, gap-filling dielectric segments 214a, 214b, and 214c can comprise tetraethylorthosilicate (TEOS) oxide or other appropriate oxide.

In the present embodiment, gap-filling dielectric segments 214a, 214b, and 214c can be formed by depositing a layer of HDP oxide over mask segments 202a through 202d and gate dielectric layer 208 by using a chemical vapor deposition (CVD) process or other appropriate deposition process. A planarizing process, such as a chemical mechanical polish (CMP) process, is then utilized to remove an excess portion of HDP oxide and, thereby, form gap-filling dielectric segments 214a, 214b, and 214c. It is noted that only gap-filling dielectric segments 214a, 214b, and 214c are specifically discussed herein to preserve brevity. The result of step 172 of flowchart 100 is illustrated by structure 272 in FIG. 2B.

Figure 2C:
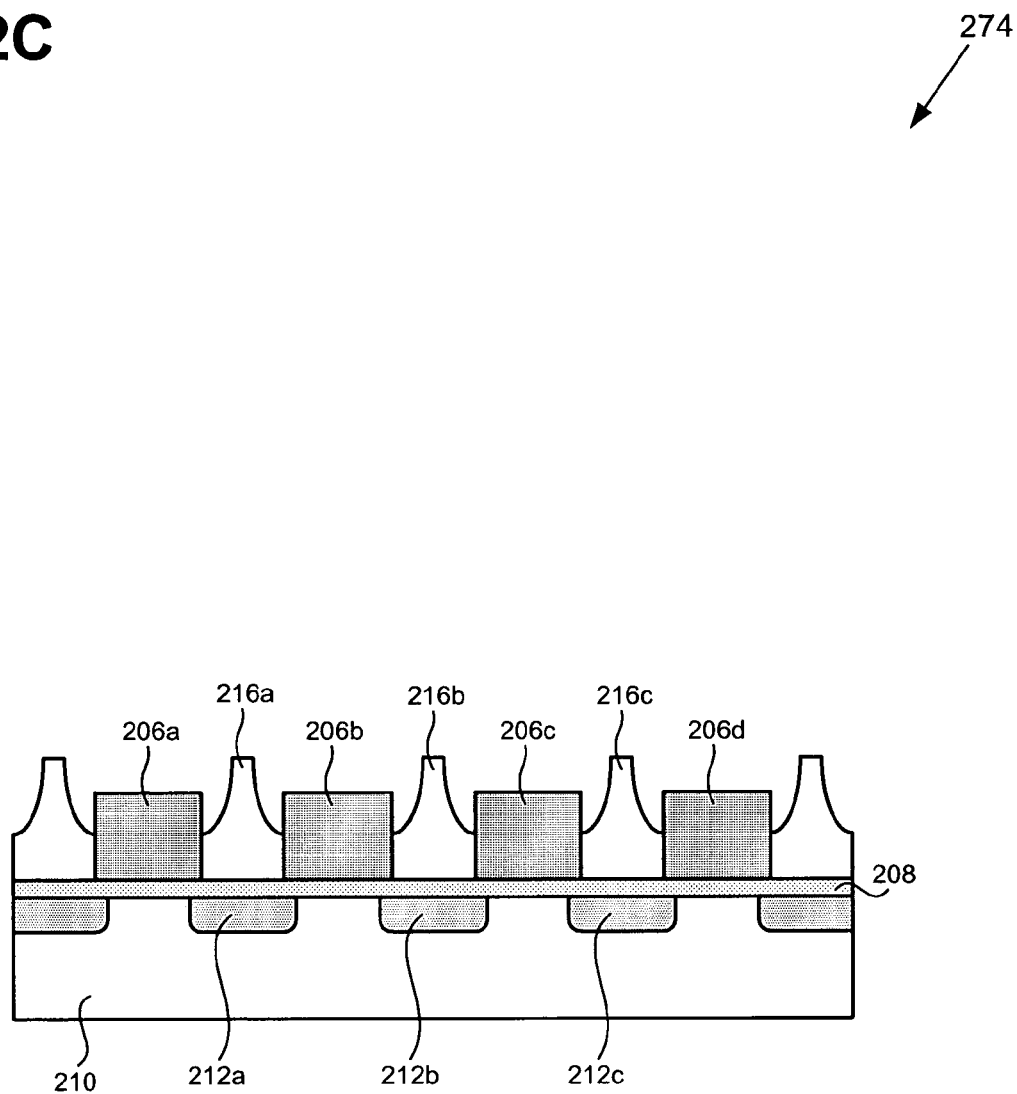
FIG. 2C illustrates a cross-sectional view, which includes a portion of a wafer processed according to an embodiment of the invention, corresponding to an intermediate step in the flowchart in FIG. 1.

Referring to step 174 in FIG. 1 and structure 274 in FIG. 2C, at step 174 of flowchart 100, mask segments 202a through 202d (FIG. 2B), intermediate dielectric segments 204a through 204d (FIG. 2B), and a portion of gap-filling dielectric segments 214a, 214b, and 214c (FIG. 2B) are removed. Mask segments 202a through 202d (FIG. 2B) can be removed by using an appropriate strip process and intermediate dielectric segments 204a through 204d (FIG. 2B) and a portion of gap-filling dielectric segments 214a, 214b, and 214c (FIG. 2B) can be removed in a wet etch process by using a wet etchant such as hydrofluoric (HF) acid or other appropriate wet etchant. As shown in FIG. 2C, gap-filling dielectric segments 216a, 216b, and 216c are situated over bitlines 212a, 212b, and 212c and comprise remaining portions of gap-filling dielectric segments 214a, 214b, and 214c (FIG. 2B), respectively. It is noted that only gap-filling dielectric segments 216a, 216b, and 216c are specifically discussed herein to preserve brevity. The result of step 174 of flowchart 100 is illustrated by structure 274 in FIG. 2C.

Figure 2D:
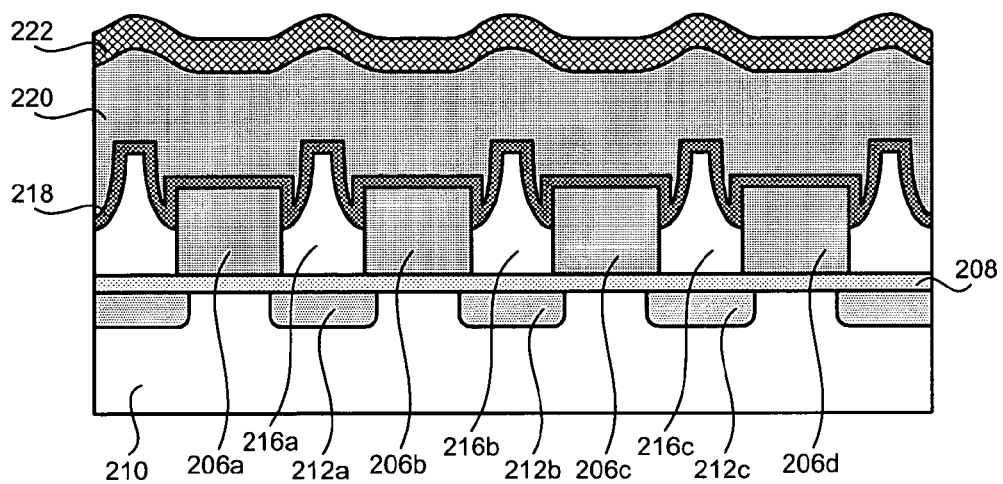
FIG. 2D illustrates a cross-sectional view, which includes a portion of a wafer processed according to an embodiment of the invention, corresponding to final step in the flowchart in FIG. 1.

Referring to step 176 in FIG. 1 and structure 276 in FIG. 2D, at step 176 of flowchart 100, interpoly dielectric layer 218, poly 2 layer (a second layer of polysilicon) 220, and anti-reflective coating (ARC) layer 222 are sequentially formed over gap-filling dielectric segments 216a, 216b, and 216c and poly 1 segments 206a through 206d. As shown in FIG. 2D, interpoly dielectric layer 218 is situated on gap-filling dielectric segments 216a, 216b, and 216c and poly 1 segments 206a through 206d, can comprise an ONO stack or other appropriate dielectric material, and can be formed by using an appropriate deposition process. Also shown in FIG. 2D, poly 2 layer 220 is situated on interpoly dielectric layer 218, can comprise polycrystalline silicon, and can be formed by using a CVD process or other appropriate deposition process. Further shown in FIG. 2D, ARC layer 222 is situated on poly 2 layer 220, can comprise silicon oxynitride or other appropriate dielectric material, and can be formed by using a CVD process or other appropriate deposition process.

Also at step 176 of flowchart 100, parallel stacked gate structures (not shown in FIG. 2D) are formed over and aligned perpendicular to bitlines 212a, 212b, and 212c. The parallel stacked gate structures (not shown in FIG. 2D), which comprise respective wordlines, can be formed by appropriately patterning and etching ARC layer 222, poly 2 layer 220, interpoly dielectric layer 218, poly 1 segments 206a through 206d, and gap-filling dielectric segments 216a, 216b, and 216c. The result of step 176 of flowchart 100 is illustrated by structure 276 in FIG. 2D.

Thus, in the embodiment in FIG. 1, by depositing a poly 1 layer prior to depositing a layer of silicon nitride (e.g. a masking layer) in the present invention, poly 1 segments 206a through 206d are formed before the bitlines 212a, 212b, and 212c are implanted. As a result, the bitlines are advantageously self-aligned to the poly 1 segments, which advantageously increased reliability in the present invention's virtual ground floating gate memory array. Also, by forming gap-filling dielectric segments between adjacent poly 1 segments by depositing HDP oxide or other appropriate oxide and using a planarizing process, the embodiment of the present invention in FIG. 1 advantageously provides a thick oxide layer over the bitlines without using an oxidation process, which has a significantly higher thermal cycle, to grow the thick oxide layer. As a result, the present invention advantageously provides a virtual ground floating gate memory array fabrication process having a reduced thermal, which increases memory array scalability and reliability by advantageously reducing undesirable bitline diffusion.

Figure 3:
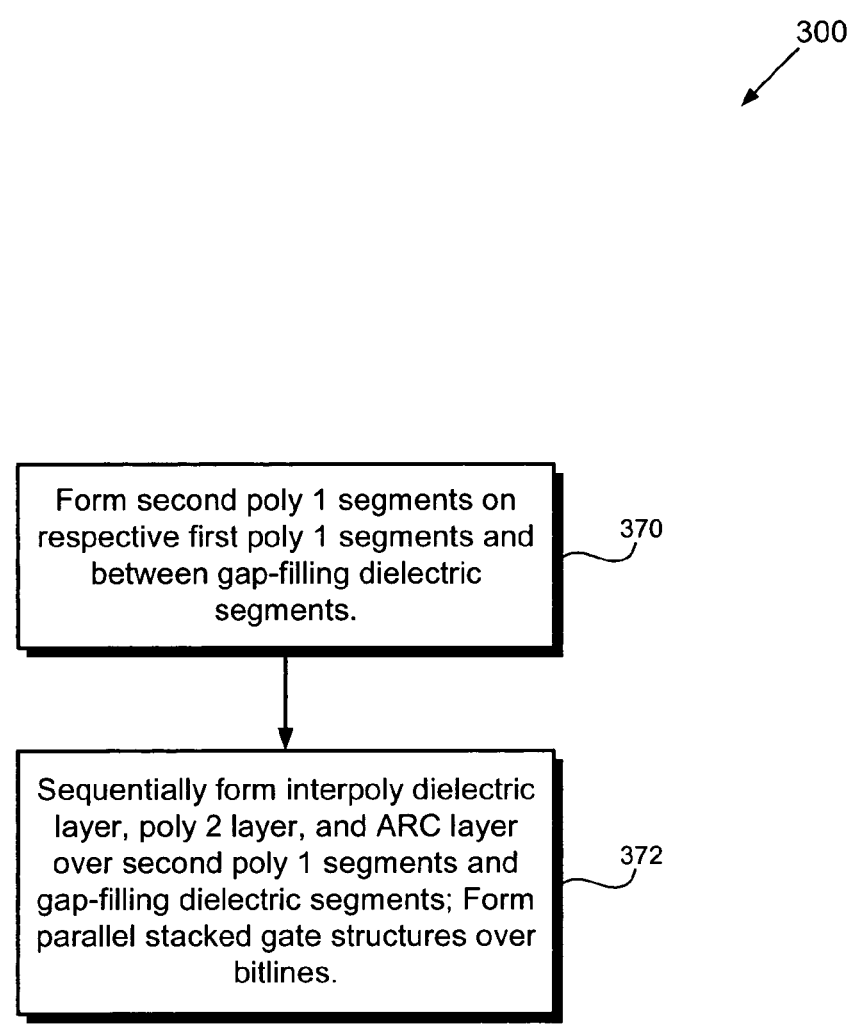
FIG. 3 shows a flowchart illustrating the steps taken to implement an embodiment of the present invention.

FIG. 3 shows a flowchart illustrating an exemplary method according to an embodiment of the present invention. Certain details and features have been left out of flowchart 300 that are apparent to a person of ordinary skill in the art. For example, a step may consist of one or more substeps or may involve specialized equipment, as known in the art. While steps 370 and 372 indicated in flowchart 300 are sufficient to describe one embodiment of the present invention, other embodiments of the invention may use steps that are different from those shown in flowchart 300. It is noted that in the embodiment of the present invention in FIG. 3, steps 170 and 172 of flowchart 100 in FIG. 1 are performed on a wafer prior to performance of step 370 in flowchart 300. Thus, step 370 in flowchart 300 is performed on a structure, such as structure 274 in FIG. 2C, that includes poly 1 segments situated on a gate dielectric layer and gap-filling dielectric segments situated between adjacent poly 1 segments and situated over bitlines, which are formed in a substrate.

Figure 4A:
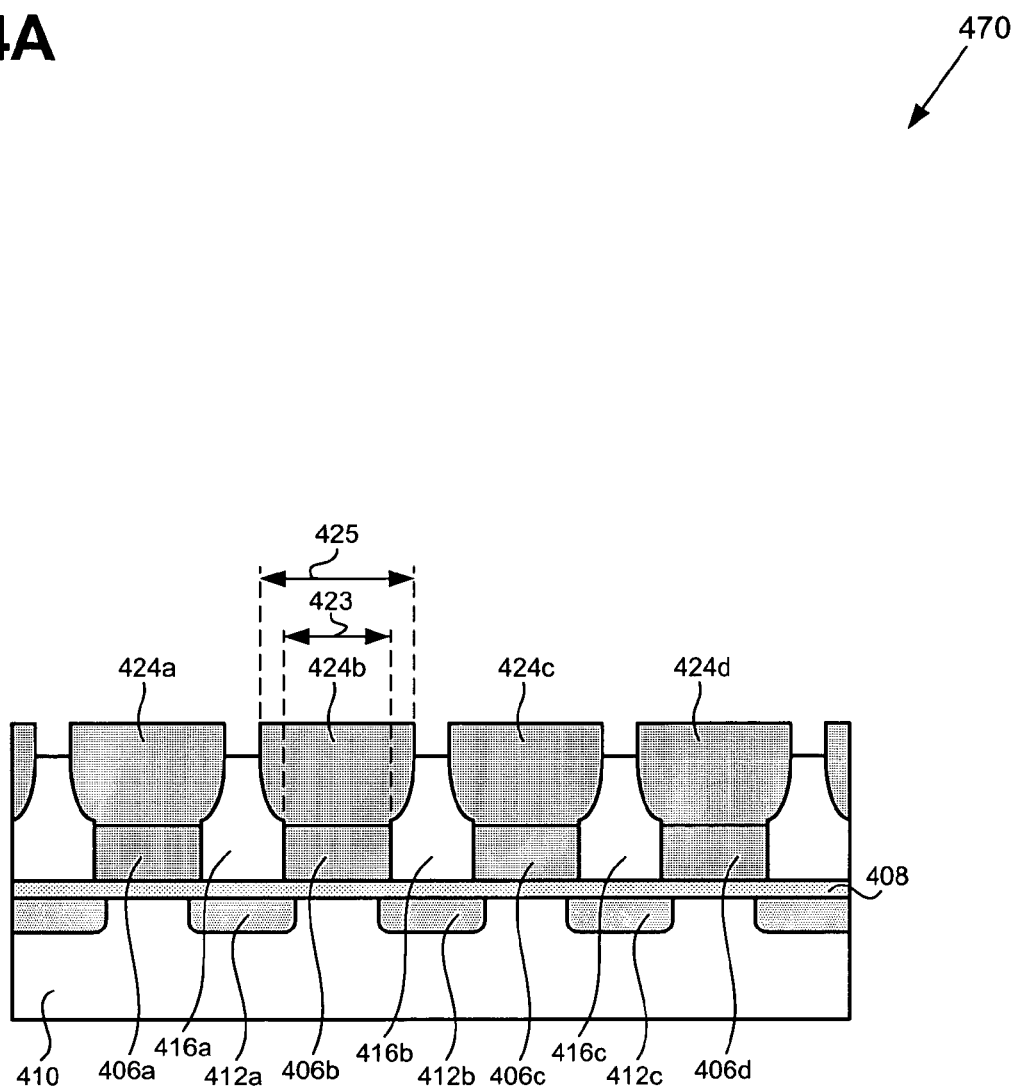
FIG. 4A illustrates a cross-sectional view, which includes a portion of a wafer processed according to an embodiment of the invention, corresponding to an initial step in the flowchart in FIG. 3.
Figure 4B:
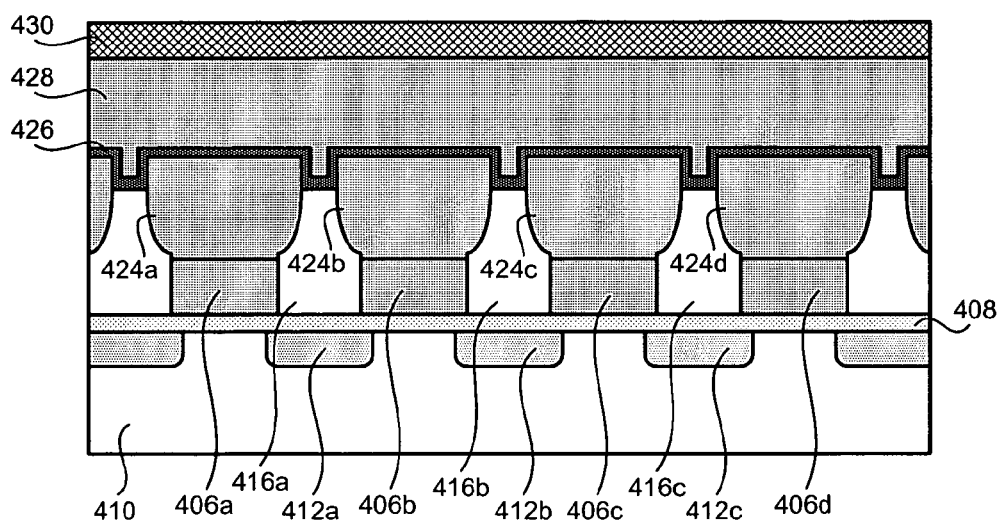
FIG. 4B illustrates a cross-sectional view, which includes a portion of a wafer processed according to an embodiment of the invention, corresponding to a final step in the flowchart in FIG. 3.

Referring to FIGS. 4A and 4B, each of structures 470 and 472 illustrates the result of performing steps 370 and 372, respectively, of flowchart 300 in FIG. 3. Thus, structure 470 shows the result of performing step 370 and structure 472 shows the result of performing step 372. Structures 470 and 472 illustrate intermediate structures that are formed during fabrication of a virtual ground floating gate memory array, such as a virtual ground floating gate flash memory array, according to an embodiment of the present invention.

Referring now to step 370 in FIG. 3 and structure 470 in FIG. 4A, at step 370 of flowchart 300, second poly 1 segments 424a, 424b, 424c, and 424d (hereinafter "second poly 1 segments 424a through 424d") are formed on respective first poly 1 segments 406a, 406b, 406c, and 406d (hereinafter "first poly 1 segments 406a through 406d") and between adjacent gap-filling dielectric segments. In structure 470 in FIG. 4A, poly gate dielectric layer 408, first poly 1 segments 406a through 406d, substrate 410, and bitlines 412a, 412b, and 412c correspond, respectively, to poly gate dielectric layer 208, poly 1 segments 206a through 206d, substrate 210, and bitlines 212a, 212b, and 212c in structure 274 in FIG. 2C.

As shown in FIG. 4A, bitlines 412a, 412b, and 412c are situated in substrate 410, gate dielectric layer 408 is situated on substrate 410, and first poly 1 segments 406a through 406d are situated on gate dielectric layer 408. As also shown in FIG. 4A, gap-filling dielectric segments 416a, 416b, and 416c are situated on gate dielectric layer 408 and over respective bitlines 412a, 412b, and 412c. Gap-filling dielectric segments 416a, 416b, and 416c are also situated between adjacent first poly 1 segments and adjacent second poly 1 segments. For example, gap-filling dielectric segment 416a is situated between first poly 1 segments 406a and 406b and second poly 1 segments 424a and 424b, gap-filling dielectric segment 416b is situated between first poly 1 segments 406b and 406c and second poly 1 segments 424b and 424c, and so forth. Gap-filling dielectric segments 416a, 416b, and 416c are substantially similar in composition and formation to gap-filling dielectric segments 216a, 216b, and 216c in FIG. 2C. However, the thickness of gap-filling dielectric segments 416a, 416b, and 416c can be greater than the thickness of gap-filling dielectric segments 216a, 216b, and 216c in FIG. 2C. In one embodiment, gap-filling dielectric segments 416a, 416b, and 416c and gap-filling dielectric segments 216a, 216b, and 216c can have an approximately equal thickness.

Further shown in FIG. 4A, second poly 1 segments 424a through 424d are situated on respective first poly 1 segments 406a through 406d and can comprise polycrystalline silicon. Second poly 1 segments 424a through 424d can be formed by depositing a layer of polysilicon over gap-filling dielectric segments 416a, 416b, and 416c and first poly 1 segments 406a through 406d by using a CVD process or other appropriate deposition process. A planarizing process, such as a CMP process, is then utilized to remove polysilicon and, thereby, form second poly 1 segments 424a through 424d. Second poly 1 segments 424a through 424d are formed such that top surface width 425 of second poly 1 segments 424a through 424d is greater than top surface width 423 of respective first poly 1 segments 406a through 406d. It is noted that in FIG. 4A only gap-filling dielectric segments 416a, 416b, and 416c are specifically discussed herein to preserve brevity. The result of step 370 of flowchart 300 is illustrated by structure 472 in FIG. 4A.

Referring now to step 372 in FIG. 3 and structure 472 in FIG. 4B, at step 372 of flowchart 300, interpoly dielectric layer 426, poly 2 layer 428, and ARC layer 430 are sequentially formed over second poly 1 segments 424a through 424d and gap-filling dielectric segments 416a, 416b, and 416c. As shown in FIG. 4B, interpoly dielectric layer 426 is situated on gap-filling dielectric segments 416a, 416b, and 416c and second poly 1 segments 424a through 424d, can comprise an ONO stack or other appropriate dielectric material, and can be formed by using an appropriate deposition process. Also shown in FIG. 4B, poly 2 layer 428 is situated on interpoly dielectric layer 426, can comprise polycrystalline silicon, and can be formed by using a CVD process or other appropriate deposition process. Further shown in FIG. 4B, ARC layer 430 is situated on poly 2 layer 428, can comprise silicon oxynitride or other appropriate dielectric material, and can be formed by using a CVD process or other appropriate deposition process.

Also at step 372 of flowchart 300, parallel stacked gate structures (not shown in FIG. 4B) are formed over and aligned perpendicular to bitlines 412a, 412b, and 412c. The parallel stacked gate structures (not shown in FIG. 4B), which comprise respective wordlines, can be formed by appropriately patterning and etching ARC layer 430, poly 2 layer 428, interpoly dielectric layer 426, second poly 1 segments 424a through 424d, gap-filling dielectric segments 416a, 416b, and 416c, and first poly 1 segments 406a through 406d. The result of step 372 of flowchart 300 is illustrated by structure 472 in FIG. 4B.

The embodiment of the present invention in FIG. 3 provides similar advantages as the embodiment of the present invention in FIG. 1 discussed above. Additionally, by forming second poly 1 segments on respective first poly 1 segments such that the top surface width of the second poly 1 segments is greater than the top surface width of the first poly 1 segments, the embodiment of the present invention in FIG. 3 advantageously achieves increased coupling ratio compared to the embodiment of the present invention in FIG. 1.

Thus, as discussed above, in the embodiments in FIGS. 1 and 3, the present invention provides a fabrication process for a virtual ground floating gate memory array that provides bitlines that are self-aligned to poly 1 segments and also achieves a reduced thermal cycle after bitline formation, which advantageously reduces undesirable bitline diffusion and, thereby, increases memory array reliability and scalability. Also, in the embodiment in FIG. 3, the present invention advantageously achieves an increased coupling ratio by forming second poly 1 segments on first poly 1 segments, where the second poly 1 segments have a top surface width that is greater than the top surface width of the first poly 1 segments. Thus, the present invention advantageously achieves an effective method for fabricating a virtual ground memory array, such as a virtual ground floating gate flash memory array, having increased reliability and scalability.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a reliable and scalable virtual ground memory array formed with reduced thermal cycle has been described.

The invention claimed is:

1. A method for fabricating a virtual ground memory array, said method comprising steps of:

forming a plurality polysilicon segments on a gate dielectric layer, said gate dielectric layer being situated on a substrate;

forming a plurality of bitlines in said substrate, each of said plurality of bitlines being situated adjacent to at least one of said plurality of polysilicon segments;

forming a gap-filling dielectric segment over said each of said plurality of bitlines, said gap-filling dielectric segment being situated on said gate dielectric layer;

wherein said step of forming said plurality of bitlines in said substrate is performed after said step of forming said plurality of polysilicon segments on said gate dielectric layer, and wherein said virtual ground memory array is a virtual ground floating gate memory array.

2. The method of claim 1 wherein said virtual ground floating gate memory array is a virtual ground floating gate flash memory array.

3. The method of claim 1 wherein said step of forming said plurality polysilicon segments on said gate dielectric layer comprises steps of:

depositing a first polysilicon layer over said gate dielectric layer;

depositing a masking layer over said first polysilicon layer;

patterning and etching said masking layer and said first polysilicon layer;

removing said masking layer and a portion of said gap-filling dielectric segment;

depositing an interpoly dielectric layer on said plurality of polysilicon segments and on a remaining portion of said gap-filling dielectric segment.

4. The method of claim 3 further comprising a step of forming a second polysilicon layer over said interpoly dielectric layer.

5. A method for fabricating a virtual ground memory array, said method comprising steps of:

forming a first plurality of polysilicon segments on a gate dielectric layer, said gate dielectric layer being situated on a substrate;

forming a plurality of bitlines in said substrate, each of said plurality of bitlines being situated adjacent to at least one of said first plurality of polysilicon segments;

forming a gap-filling dielectric layer over said first plurality of polysilicon segments and said gate dielectric layer;

planarizing said gap-filling dielectric layer to form a plurality of gap-filling dielectric segments, each of said plurality of gap-filling dielectric segments being situated over one of said plurality of bitlines and on said gate dielectric layer;

wherein said step of forming said plurality of bitlines in said substrate is performed after said step of forming said first plurality of polysilicon segments on said gate dielectric layer, and wherein said virtual ground memory array is a virtual ground floating gate memory array.

6. The method of claim 5 wherein said virtual ground floating gate memory array is a virtual ground floating gate flash memory array.

* * * * *